(12) United States Patent
Jeong et al.

(10) Patent No.: US 9,576,672 B2
(45) Date of Patent: *Feb. 21, 2017

(54) NON-VOLATILE MEMORY DEVICE AND RELATED METHOD OF OPERATION

(71) Applicant: SAMSUNG ELECTRONICS CO., LTD., Suwon-Si, Gyeonggi-Do (KR)

(72) Inventors: Jaeyong Jeong, Yongin-Si (KR); Ju Seok Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 32 days.

This patent is subject to a terminal disclaimer.

(21) Appl. No.: 14/617,976

(22) Filed: Feb. 10, 2015

(65) Prior Publication Data

US 2015/0155048 A1    Jun. 4, 2015

Related U.S. Application Data

(63) Continuation of application No. 13/526,794, filed on Jun. 19, 2012, now Pat. No. 8,976,595.

(30) Foreign Application Priority Data

Jun. 21, 2011    (KR) .................. 10-2011-0060289

(51) Int. Cl.
G11C 16/26    (2006.01)
G11C 11/56    (2006.01)
G11C 16/34    (2006.01)
G11C 16/24    (2006.01)

(52) U.S. Cl.
CPC ........... *G11C 16/26* (2013.01); *G11C 11/5642* (2013.01); *G11C 16/24* (2013.01); *G11C 16/3454* (2013.01)

(58) Field of Classification Search
CPC .................................................. G11C 16/0483
USPC .................................................... 365/185.18
See application file for complete search history.

(56) References Cited

U.S. PATENT DOCUMENTS

| 7,257,027 B2 | 8/2007 | Park |
| 7,274,617 B2 | 9/2007 | Sakurai et al. |
| 8,861,276 B2 * | 10/2014 | Shim ................... G11C 11/5642 365/185.18 |
| 8,976,595 B2 * | 3/2015 | Jeong .................. G11C 11/5642 365/185.18 |
| 2004/0090847 A1 | 5/2004 | Takeuchi et al. |

(Continued)

FOREIGN PATENT DOCUMENTS

| JP | 2006-147111 | 6/2006 |
| JP | 2007-012240 | 1/2007 |

(Continued)

*Primary Examiner* — Min Huang
(74) *Attorney, Agent, or Firm* — Volentine & Whitt, PLLC

(57) ABSTRACT

A nonvolatile memory device comprises a cell array connected to a plurality of bit lines in an all bit line structure, a page buffer circuit connected to the plurality of bit lines, and control logic configured to control the page buffer circuit. The control logic controls the page buffer circuit to sense memory cells corresponding to both even-numbered and odd-numbered columns of a selected page in a first read mode and to sense memory cells corresponding to one of the even-numbered and odd-numbered columns of the selected page in a second read mode. A sensing operation is performed at least twice in the first read mode and once in the second read mode.

26 Claims, 14 Drawing Sheets

(56) References Cited

U.S. PATENT DOCUMENTS

| | | | |
|---|---|---|---|
| 2006/0104113 A1 | 5/2006 | Hsieh et al. | |
| 2006/0271748 A1* | 11/2006 | Jain | G11C 7/1021 |
| | | | 711/154 |
| 2007/0268745 A1 | 11/2007 | Lasser | |
| 2008/0205163 A1* | 8/2008 | Park | G11C 11/5621 |
| | | | 365/185.23 |
| 2008/0298127 A1 | 12/2008 | Kim et al. | |
| 2009/0059660 A1 | 3/2009 | Lee et al. | |
| 2010/0046290 A1 | 2/2010 | Park et al. | |
| 2010/0061151 A1* | 3/2010 | Miwa | G11C 11/5628 |
| | | | 365/185.17 |
| 2010/0177568 A1* | 7/2010 | Chen | G11C 16/26 |
| | | | 365/185.18 |
| 2010/0202206 A1* | 8/2010 | Seol | G11C 16/0408 |
| | | | 365/185.17 |
| 2011/0246855 A1* | 10/2011 | Cheng | G06F 11/1068 |
| | | | 714/759 |
| 2012/0240011 A1* | 9/2012 | Helm | G11C 16/28 |
| | | | 714/773 |
| 2012/0331210 A1 | 12/2012 | Jeong et al. | |
| 2013/0194883 A1 | 8/2013 | Lee | |

FOREIGN PATENT DOCUMENTS

| | | |
|---|---|---|
| KR | 1020060058030 A | 5/2006 |
| KR | 1020070002344 A | 1/2007 |
| KR | 1020110001080 A | 1/2011 |

\* cited by examiner tPRE_2H > tPRE_1F

NON-VOLATILE MEMORY DEVICE AND RELATED METHOD OF OPERATION

CROSS-REFERENCE TO RELATED APPLICATIONS

This is a Continuation of U.S. application Ser. No. 13/526,794, filed Jun. 19, 2012, which makes a claim of priority under 35 U.S.C §119 to Korean Patent Application No. 10-2011-0060289, filed on Jun. 21, 2011, the disclosures of which are hereby incorporated by reference.

BACKGROUND OF THE INVENTION

Embodiments of the inventive concept relate generally to electronic memory technologies. More particularly, embodiments of the inventive concept relate to semiconductor memory devices and methods of performing read operations in the semiconductor memory devices.

Semiconductor memory devices can be roughly divided into two categories according to whether they retain stored data when disconnected from power. These categories include volatile semiconductor memory devices, which lose stored data when disconnected from power, and nonvolatile semiconductor memory devices, which retain stored data when disconnected from power. Examples of volatile semiconductor memory devices include dynamic random access memory (DRAM) and static random access memory (SRAM). Examples of nonvolatile semiconductor memory devices include masked read-only memory (MROM), programmable read-only memory (PROM), erasable programmable read-only memory (EPROM), and electrically erasable programmable read-only memory (EEPROM).

Flash memory is a type of EEPROM that has achieved increasing popularity in recent years due to attractive features such as relatively high storage capacity, low power consumption, and an ability to withstand physical shock. Flash memory is currently used in a wide variety of technologies, such as computers, cellular phones, personal digital assistants, digital cameras, camcorders, voice recorders, multimedia players, handheld personal computers, gaming consoles, fax machines, scanners, and printers, to name but a few.

In an effort to increase the storage capacity of flash memory and other forms of nonvolatile memory, researchers have developed so-called multi-bit memory devices. A multi-bit memory device is a device capable of storing more than one bit of data per memory cell. For example, a two-bit flash memory device may store two bits per memory cell. Although storing more than one bit of data in each memory cell may provide increased storage capacity, it can also lead to various complications in device operation, such as decreased read margins and increased error rates.

SUMMARY OF THE INVENTION

In one embodiment of the inventive concept, a nonvolatile memory device comprises a cell array connected to a plurality of bit lines in an all bit line structure, a page buffer circuit connected to the plurality of bit lines, and control logic configured to control the page buffer circuit. The control logic controls the page buffer circuit to sense memory cells corresponding to both even-numbered and odd-numbered columns of a selected page in a first read mode and to sense memory cells corresponding to one of the even-numbered and odd-numbered columns of the selected page in a second read mode. A sensing operation is performed at least twice in the first read mode and once in the second read mode.

In another embodiment of the inventive concept, a nonvolatile memory device comprises a cell array comprising a plurality of memory cells each configured to store multiple bits, a page buffer circuit connected to bit lines of the cell array, a voltage generator configured to provide a read voltage to selected memory cells of the cell array, and control logic configured to control the page buffer circuit and the voltage generator. The control logic controls the page buffer circuit to perform a coarse sensing operation on a selected page of memory cells, to select memory cells determined to be off cells by the coarse sensing operation, and to perform a fine sensing operation on the selected memory cells determined to be off cells.

In another embodiment of the inventive concept, a method is provided for performing a read operation in a nonvolatile memory device comprising a cell array connected to a plurality of bit lines in an all bit line structure, a page buffer circuit connected to the plurality of bit lines, and control logic configured to control the page buffer circuit. The method comprises controlling the page buffer circuit to sense memory cells corresponding to both even-numbered and odd-numbered columns of a selected page in a first read mode, controlling the page buffer circuit to sense memory cells corresponding to one of the even-numbered and odd-numbered columns of the selected page in a second read mode, and performing a sensing operation at least twice in the first read mode and once in the second read mode.

These and other embodiments of the inventive concept can potentially improve both performance and reliability of read operations performed in nonvolatile memory devices.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Although the terms first, second, third, etc., may be used herein to describe various features, the described features should not be limited by these terms. Rather, these terms are used merely to distinguish between different features. Thus, a first feature could alternatively be termed a second feature without changing the meaning of the relevant description.

The terminology used herein is for the purpose of describing particular embodiments only and is not intended to be limiting of the inventive concept. As used herein, the singular forms "a", "an" and "the" are intended to encompass the plural forms as well, unless the context clearly indicates otherwise.

The terms "comprises" and/or "comprising," where used in this specification, indicate the presence of stated features but they do not preclude the presence of other features. As used herein, the term "and/or" indicates any and all combinations of one or more of the associated listed items.

Where an element or layer is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

Figure 1:
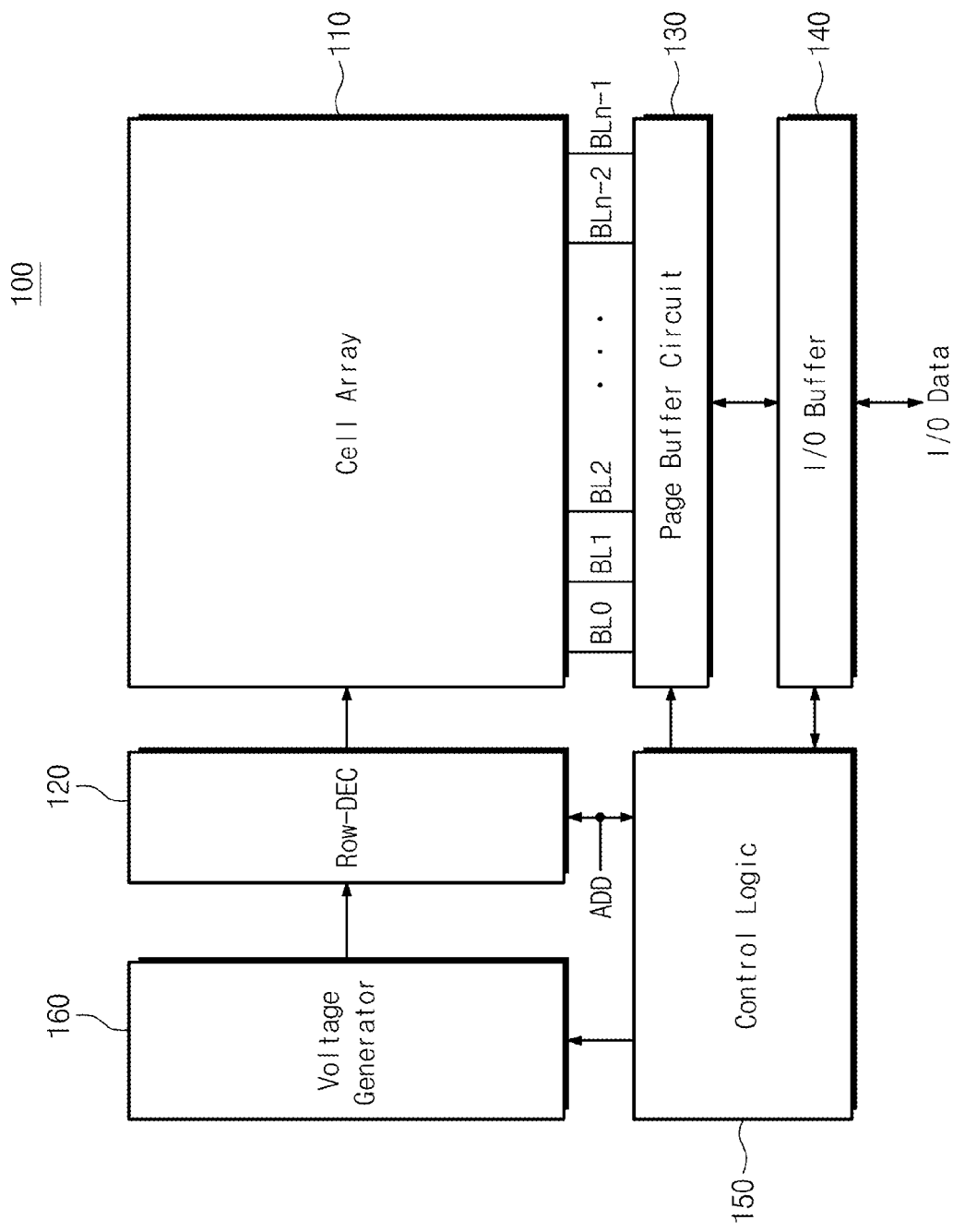
FIG. 1 is a block diagram illustrating a nonvolatile memory device according to an embodiment of the inventive concept.

FIG. 1 is a block diagram illustrating a nonvolatile memory device 100 according to an embodiment of the inventive concept.

Referring to FIG. 1, nonvolatile memory device 100 comprises a cell array 110, a row decoder 120, a page buffer circuit 130, an input/output buffer 140, control logic 150, and a voltage generator 160.

Cell array 110 is coupled to row decoder 120 via word lines or selection lines. Cell array 110 is coupled to page buffer circuit 130 via bit lines BL0 to BLn−1. Cell array 110 comprises a plurality of NAND cell strings each comprising a channel formed in a vertical or horizontal direction. The word lines of cell array 110 are stacked in a vertical direction. Cell array 110 typically has an all bit line (ABL) structure.

Row decoder 120 selects a memory block of cell array 110, and it also selects a word line in the selected memory block. Row decoder 120 transfers voltages provided from voltage generator 160 to word lines of the selected memory block. In a program operation, row decoder 120 transfers a program voltage Vpgm to the selected word line and a pass voltage Vpass to an unselected word line. In a read operation, row decoder 120 transfers a selection read voltage Vrd to the selected word line and transfers a non-selection read voltage (or, a read pass voltage) Vread to the unselected word line.

Page buffer circuit 130 operates as a write driver or a sense amplifier according to a mode of operation. In a program operation, page buffer circuit 130 provides a bit line of cell array 110 with a bit line voltage corresponding to program data. In a read operation, page buffer circuit 130 senses data stored in a selected memory cell via a bit line. Page buffer circuit 130 then latches the sensed data and outputs it to input/output buffer 140.

Page buffer circuit 130 is coupled with cell array 110 having the ABL structure. Page buffer circuit 130 senses all memory cells connected with a selected word line in a first read mode, referred to as a full page read mode. Page buffer circuit 130 selectively senses some memory cells connected with the selected word line in a second read mode, referred to as a partial page read mode.

In the partial page read mode, page buffer circuit 130 grounds bit lines of unselected memory cells. This enables bit lines of selected memory cells to be shielded by the grounded bit lines. The partial page read mode may be, for example, a half page read mode or a quarter page read mode. In the half page read mode, half of the memory cells in a selected page are read. In the quarter page read mode, a quarter of the memory cells in a selected page are read. In the description that follows, it will be assumed for explanation purposes that the half page read mode is used as the partial page read mode.

In a program operation, input/output buffer 140 transfers input write data (or, program data) into page buffer circuit 130. In a read operation, input/output buffer 140 outputs read data provided from page buffer circuit 130 to an external device. Input/output buffer 140 also transfers input addresses and/or commands to control logic 150 or row decoder 120.

Control logic 150 controls page buffer circuit 130 and voltage generator 160 in response to a command CMD and an address ADD transferred from input/output buffer 140. Control logic 150 controls page buffer circuit 130 and voltage generator 160 such that selected memory cells are sensed in different manners according to a read mode. The use of different sensing manners can potentially reduce sensing noise in a read operation.

In the full page read mode, control logic 150 controls page buffer circuit 130 and voltage generator 160 to sense selected memory cells in a coarse-fine sensing manner. In the partial page read mode, control logic 150 controls page buffer circuit 130 and voltage generator 160 to sense selected memory cells in a sensing manner different from the coarse-fine sensing manner.

The coarse-fine sensing manner can be used to reduce sensing noise. During coarse-fine sensing, selected memory cells are sensed twice using different read voltages. That is, the coarse-fine sensing comprises a coarse sensing operation and a fine sensing operation. In the coarse sensing operation, selected memory cells are sensed using a level lower than a target level. In the fine sensing operation, "off" cells detected by the coarse sensing operation are selected, and then the selected off cells are sensed using the target level. Data sensed and latched in the fine sensing operation is output as final read data. In the ABL structure, some "on" cells are sensed by the coarse sensing. Because on cells selected in the coarse sensing are excluded from the fine sensing, CSL noise may be reduced.

In the partial page read mode, control logic 150 controls page buffer circuit 130 and voltage generator 160 to only sense selected memory cells using the fine sensing operation. In the partial page read mode, control logic 150 controls page buffer circuit 130 to ground unselected bit lines. Control logic 150 determines a time taken for precharging and developing selected bit lines so as to be different from that of the full page read mode.

Under the control of control logic 150, voltage generator 160 generates word line voltages to be supplied to word lines and a voltage to be supplied to a bulk region (e.g., a well region) where memory cells are formed. The word line voltages to be supplied to word lines typically include a program voltage Vpgm, a pass voltage (or, program pass voltage) Vpass, selection and non-selection read voltages Vrd and Vread, and the like. Voltage generator 160 generates selection line voltages VSSL and VGSL to be supplied to selection lines SSL and GSL in program and read operations.

Nonvolatile memory device 100 may be configured to sense selected memory cells in different manners according to the full page read mode and the partial page read mode. With this sensing scheme, CSL noise may be reduced and read speed may be improved.

Figure 2:
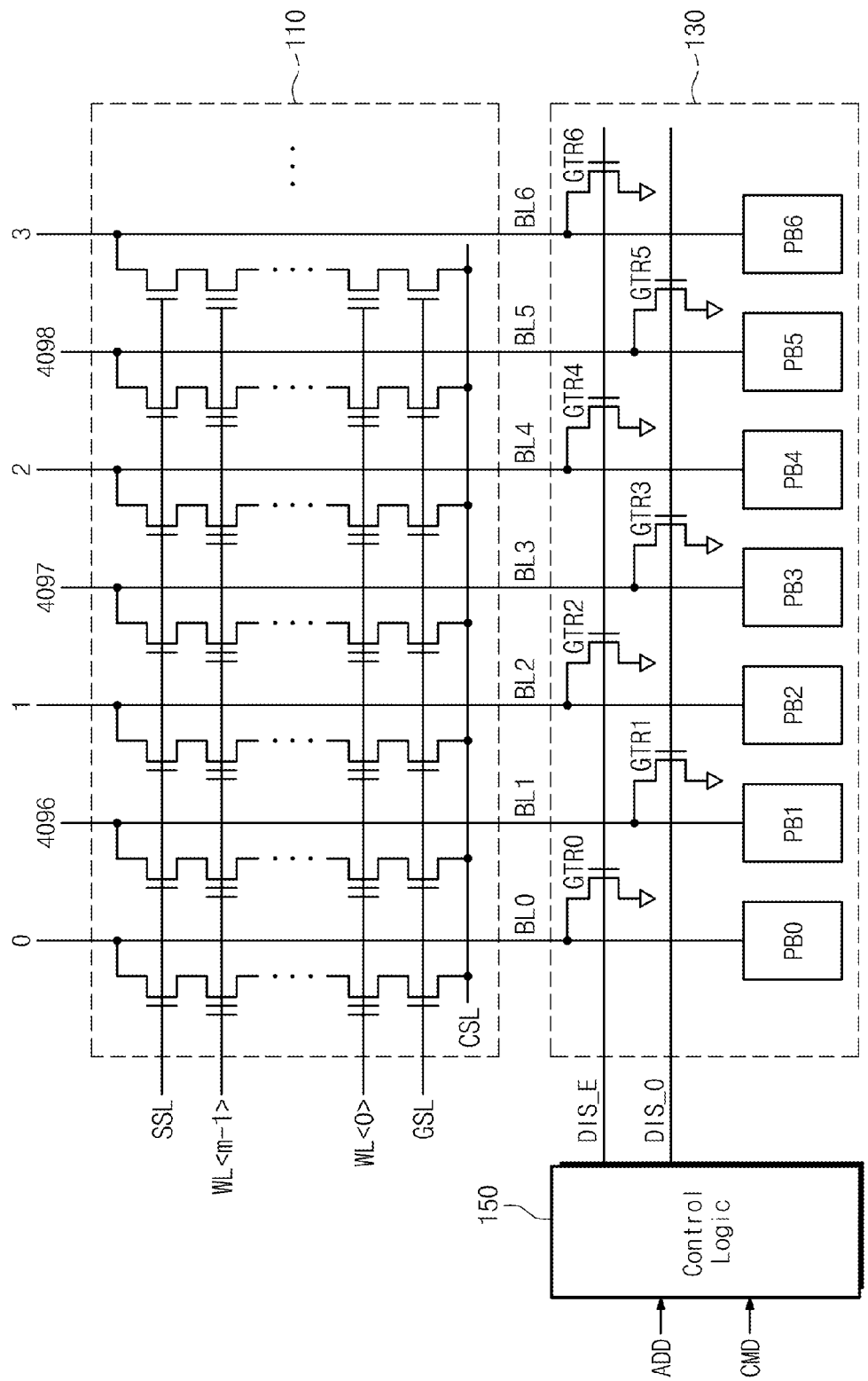
FIG. 2 is a block diagram illustrating an example of a cell array and a page buffer circuit in FIG. 1.

FIG. 2 is a block diagram illustrating an example of a cell array and a page buffer circuit shown in FIG. 1. In the example of FIG. 2, continuous column addresses are assigned to even-numbered bit lines, and continuous column addresses are assigned to odd-numbered bit lines.

Referring to FIG. 2, cell array 110 comprises a plurality of bit lines BL0 to BLn−1. Column addresses of even-numbered bit lines and odd-numbered bit lines in cell array 110 are not continuous. For example, assuming that one page has a size of 8 KB, even-numbered bit lines BLi (i=0, 2, 4, etc.) may be accessed by column addresses 0, 1, 2, etc., respectively, and odd-numbered bit lines BLj (j=1, 3, 5, etc.) may be accessed by column addresses 4096, 4097, 4098, etc., respectively.

Page buffer circuit 130 comprises page buffers PB0 to PBn−1 connected with bit lines BL0 to BLn−1, respectively. Page buffers PB0 to PBn−1 write or read data in or from selected memory cells via corresponding bit lines BL0 to BLn−1. Page buffer circuit 130 comprises ground transistors GTR0 to GTRn−1 configured to ground unselected bit lines under the control of control logic 150. Where a column address corresponding to a partial page read mode is provided, control logic 150 activates one of control signals DIS_E and DIS_O to ground unselected bit lines.

Although FIG. 2 shows ground transistors GTR0 to GTRn−1 within page buffer circuit 130, the inventive concept is not limited to this configuration, and ground transistor GTR0 to GTRn−1 can be formed outside page buffer circuit 130.

Control logic 150 outputs control signals DIS_E and DIS_O for grounding unselected bit lines according to a read mode (e.g., a full page read mode or a partial page read mode). In the full page read mode, control logic 150 inactivates control signals DIS_E and DIS_O. In the partial page read mode (e.g., a half page read mode), control logic 150 activates one of control signals DIS_E and DIS_O to ground unselected bit lines. Control logic 150 typically determines whether to activate control signals DIS_E and DIS_O based upon a command CMD or an address ADD.

In the embodiment of FIG. 2, unselected bit lines are grounded in the partial page read mode, and selected bit lines are shielded by the unselected bit lines. With the above-described column addressing manner, data sensed in the partial page read mode may be output to an external device with improved accuracy.

Figure 3:
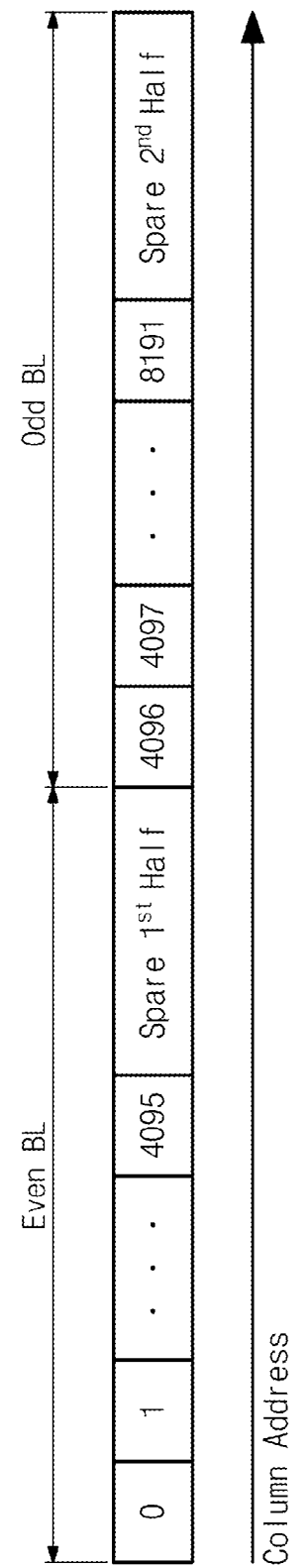
FIG. 3 is a diagram for describing an addressing method for bit lines according to an embodiment of the inventive concept.

FIG. 3 is a diagram for describing an addressing method of bit lines according to an embodiment of the inventive concept. More specifically, FIG. 3 shows a column addressing manner of an ABL structure in which an 8 KB-sized page is programmed as a unit.

Referring to FIG. 3, even-numbered bit lines BL0, BL2, BL4, . . . , BL8186, BL8188, and BL8190 are addressed by column addresses 0, 1, 2, . . . , 4093, 4094, and 4095, respectively. Odd-numbered bit lines BL1, BL3, BL5, . . . , BL8187, BL8189, and BL8191 are addressed by column addresses 4096, 4097, 4098, . . . , 8189, 8190, and 8191, respectively. In a partial page read mode in which the even-numbered bit lines are selected, data sensed via the even-numbered bit lines constitute a plurality of continuous sectors. The data sensed via the even-numbered bit lines may be output regardless of whether sensing is made via odd-numbered bit lines.

In this description, an example is provided in which the above-described addressing approach is applied to bit lines of a main area which can be selected by an external device. However, the inventive concept is not limited to this example. For instance, in an alternative read operation, bit lines of a spare area may be controlled in the same manner as those of the main area. The partial page read mode may be applied to the bit lines of the spare area, and unselected bit lines may be grounded. That is, bit lines of the spare area may include the first spare bit lines Spare $1^{st}$ Half corresponding to even-numbered bit lines, and the second spare bit lines Spare $2^{nd}$ Half corresponding to odd-numbered bit lines.

The spare area may be used to store control information associated with data of the main area, such as metadata, a flag bit, and so on. In some embodiments, data sensed via the first spare bit lines Spare $1^{st}$ Half may be configured to provide sufficient control information associated with main data sensed via the even-numbered bit lines BL0, BL2, BL4, . . . , BL8186, BL8188, and BL8190. Data sensed via the second spare bit lines Spare $2^{nd}$ Half may be configured to provide sufficient control information associated with main data sensed via the odd-numbered bit lines BL1, BL3, BL5, . . . , BL8187, BL8189, and BL8191.

In a program operation, control information associated with main data corresponding to the even-numbered bit lines may be stored in the spare area corresponding to the first spare bit lines Spare $1^{st}$ Half. Control information associated with main data corresponding to the odd-numbered bit lines may be stored in the spare area corresponding to the second spare bit lines Spare $2^{nd}$ Half.

Figure 4:
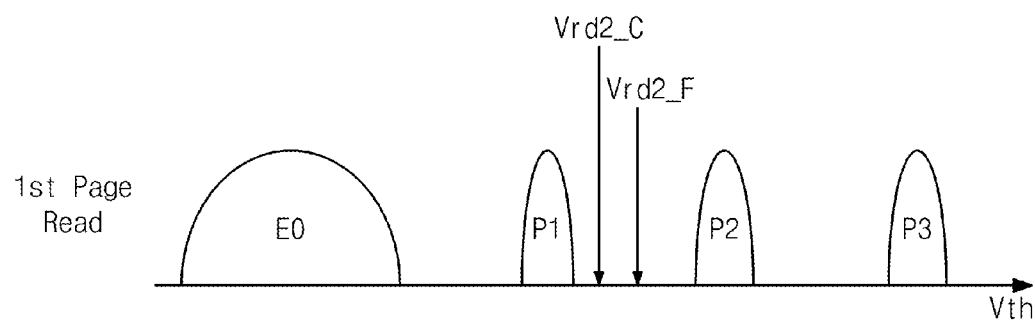
FIG. 4 is a diagram for describing a full page read mode according to an embodiment of the inventive concept.
Figure 4:
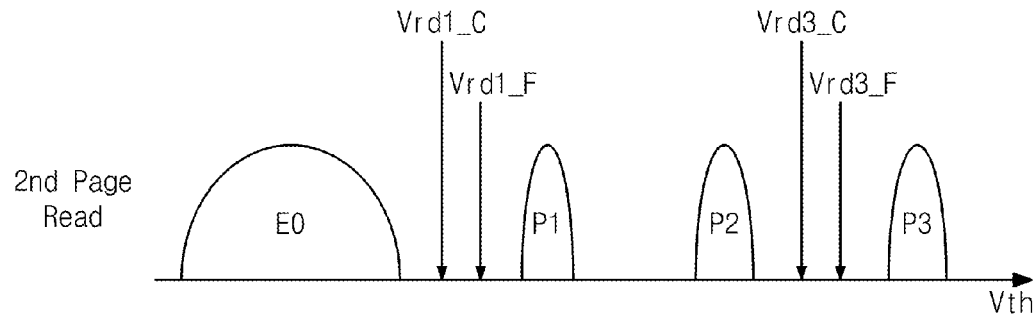

FIG. 4 is a diagram for describing a full page read mode according to an embodiment of the inventive concept.

Referring to FIG. 4, in a full page read mode, voltage generator 160 generates read voltages Vrd1_C, Vrd1_F, Vrd2_C, Vrd2_F, Vrd3_C, and Vrd3_F for coarse-fine sensing. The full page read mode will be described with reference to a 2-bit multi-level cell.

In a first page (or, most significant bit (MSB) page) read operation, voltage generator 160 generates a coarse read voltage Vrd2_C for coarse sensing. Coarse read voltage Vrd2_C is provided to a selected word line from voltage generator 160 via row decoder 120. Page buffer circuit 130 senses bit lines of selected memory cells. Page buffer circuit 130 selects memory cells maintaining a turned-on state if coarse read voltage Vrd2_C is applied to a selected word line. The coarse sensing may be made to only select off cells when a relatively low coarse read voltage Vrd2_C is provided to the selected word line.

Fine sensing is performed with respect to memory cells selected by the coarse sensing. The memory cells selected by the coarse sensing may have threshold voltages higher than coarse read voltage Vrd2_C. The fine sensing may be performed with respect to the selected memory cells using a fine read voltage Vrd2_F. Voltage generator 160 generates the fine read voltage for the fine sensing. Row decoder 120 transfers fine read voltage Vrd2_F from voltage generator 160 to the selected word line. Page buffer circuit 130 senses and latches data stored in memory cells if fine read voltage Vrd2_F is applied to the selected word line. Page buffer circuit 130 outputs data sensed via the fine sensing as data read out from the selected memory cells.

In the full page read mode, all bit lines are selected and sensed at the same time. Accordingly, CSL noise may increase as compared with the half page read mode. However, it is possible to reduce the CSL noise by execution of the coarse-fine sensing. Off cells selected by the coarse sensing may be fine sensed. Because data read by the fine sensing is output, it is possible to block the CSL noise caused by selection of all bit lines.

In the second page read operation, coarse-fine sensing is performed as follows. In a read operation for discriminating an erase state E0 and a program state P1, the coarse-fine sensing is performed using read voltages Vrd1_C and Vrd1_F. In a read operation for discriminating program states P2 and P3, the coarse-fine sensing is performed using read voltages Vrd3_C and Vrd3_F. The second page read operation may be identical to the first page read operation except that the second page read operation is used to read a least significant bit (LSB) page and levels of read voltages Vrd1_C, Vrd1_F, Vrd3_C, and Vrd3_F are different from those of read voltages Vrd2_C and Vrd2_F. Accordingly, further description of the second page read operation is omitted for the sake of brevity.

With the coarse-fine sensing as described above, all bit lines are selected during coarse sensing. In the coarse sensing, off cells are selected using relatively lower read voltages Vrd1_C, Vrd2_C, and Vrd3_C. The following fine sensing may be performed with respect to off cells selected by the coarse sensing. Accordingly, if the above-described coarse-fine sensing scheme is applied to a nonvolatile memory device with the ABL structure, CSL noise due to simultaneous selection of all bit lines may be prevented.

Figure 5:
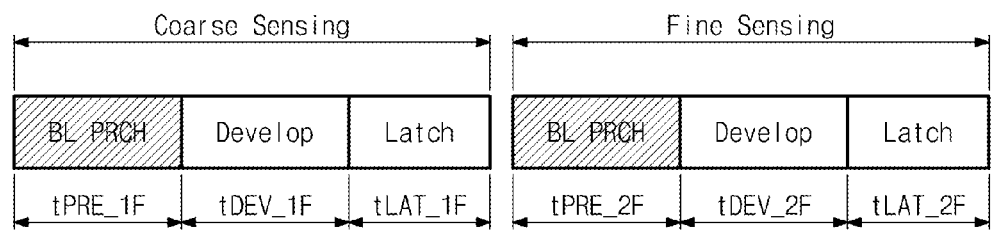
FIG. 5 is a diagram for describing a full page read mode according to an embodiment of the inventive concept.

FIG. 5 is a diagram for describing a full page read mode according to an embodiment of the inventive concept. In this embodiment, the full page read mode comprises coarse sensing and fine sensing.

Referring to FIG. 5, each of the coarse sensing and the fine sensing may comprises a bit line precharge step BL PRCH, a develop step Develop, and a latch step Latch. In the coarse sensing operation, all bit lines are precharged for a precharge time tPRE_1F. Precharged voltages of the bit lines vary during a develop time tDEV_1F according to whether memory cells are programmed. During a latch time tLAT_1F, voltage variations of the bit lines are sensed and latched by page buffers PB0 to PBn−1. Off cells are selected according to data latched via the coarse sensing. Then, the fine sensing is performed on the selected off cells.

In the fine sensing operation, bit lines of memory cells selected by the fine sensing are selected. The selected bit lines are precharged during a precharge time tRER_2F.

Precharged voltages of the bit lines vary during a develop time tDEV_2F according to whether memory cells are programmed. During a latch time tLAT_2F, voltage variations of the bit lines are sensed and latched by page buffers PB0 to PBn−1. At this time, data stored in page buffers PB0 to PBn−1 is output as read data.

Figure 6:
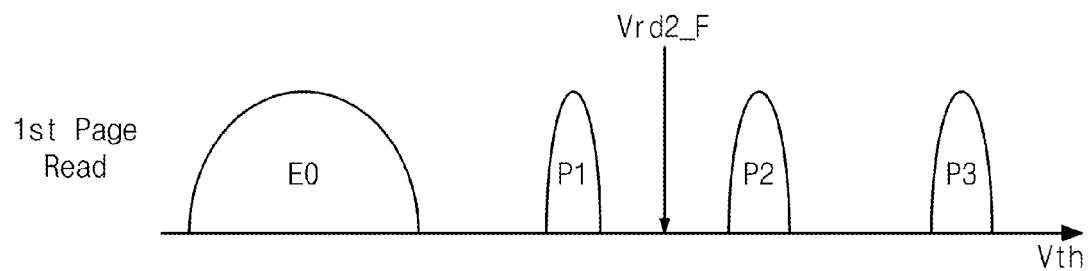
FIG. 6 is a diagram for describing a partial page read mode according to an embodiment of the inventive concept.
Figure 6:
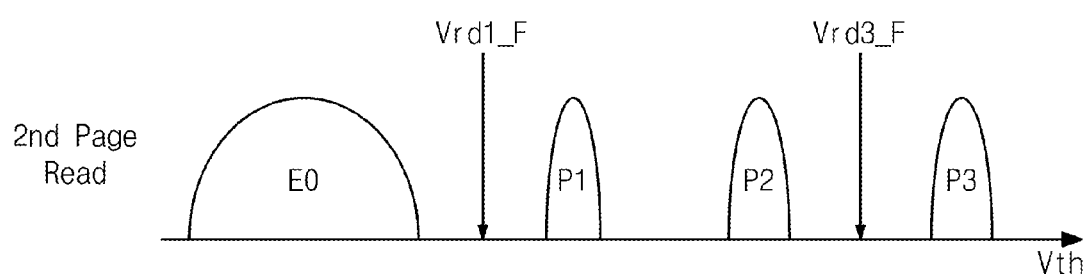

FIG. 6 is a diagram for describing a partial page read mode. In this embodiment, read voltages Vrd1_F, Vrd2_F, and Vrd3_F used for fine sensing of a full page read mode are used in a partial page read mode. That is, in the partial page read mode, sensing (e.g., a fine sensing operation) is performed once to discriminate one program state, or data state.

Referring to FIG. 6, in the first page (or, MSB page) read operation, voltage generator 160 generates a fine read voltage Vrd2_F. Fine read voltage Vrd2_F is provided to a selected word line via row decoder 120. Page buffer circuit 130 senses bit lines of selected memory cells. Page buffer circuit 130 latches data sensed by the fine sensing. Page buffer circuit 130 outputs the latched data as read data.

In the second page (or, LSB page) read operation, a sensing operation is performed to discriminate between an erase state E0 and a program state P1. Here, only the fine sensing is carried out using fine read voltage Vrd1_F. In a read operation for discriminating program states P2 and P3, the fine sensing is performed using a fine read voltage Vrd3_F. The second page read operation is identical to the first page read operation except that the second page read operation is to read an LSB page and that levels of fine read voltages Vrd1_F and Vrd3_F are different from that of fine read voltage Vrd2_F.

In the partial page read mode, sensing is performed with respect to some (e.g., even-numbered bit lines) bit lines of a selected page. A read margin for CSL noise in the partial page read mode is larger than that in a full page read mode. Accordingly, the reliability of data may be improved without two or more sensing operations like coarse-fine sensing for discriminating one program state. This means that in the partial page read mode, data is read via a fine sensing operation without a coarse sensing operation.

Although the embodiment of FIG. 6 uses the fine read voltages in both the full page read mode and the partial page read mode, the inventive concept is not limited to this condition. For example, voltages having levels different from those of read voltages used in the full page read mode can be used in the partial page read mode.

Figure 7:
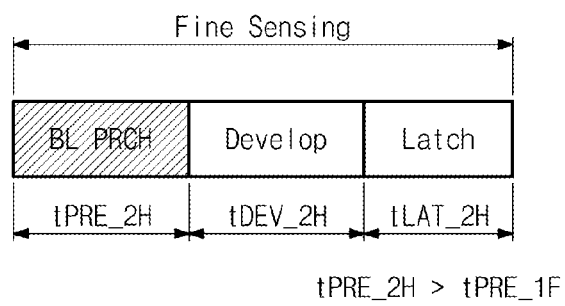
FIG. 7 is a diagram for describing a sensing operation executed in a partial page read mode according to an embodiment of the inventive concept.

FIG. 7 is a diagram for describing a sensing operation executed in a partial page read mode according to an embodiment of the inventive concept. In this embodiment, in a partial page read mode, fine sensing is performed without coarse sensing. However, time parameters of the fine sensing in the partial page read mode may be different from those at a full page read mode.

Referring to FIG. 7, a fine sensing operation comprises a bit line precharge step BL PRCH, a develop step Develop, and a latch step Latch. Bit lines selected by a column address are only precharged in the fine sensing operation executed in the partial page read mode. The selected bit lines are precharged during a precharge time tPRE_2H.

Precharged voltages of the bit lines vary during a develop time tDEV_2H according to whether memory cells are programmed. During a latch time tLAT_2H, voltage variations of the bit lines are sensed. Data stored in memory cells is latched by some of page buffers PB0 to PBn-1. At this time, data stored in page buffers PB0 to PBn-1 is output as read data.

Unselected bit lines excluded in the partial page read mode are grounded by corresponding ground transistors, and selected bit lines are precharged. Precharge and develop times of the selected bit lines may increase according to coupling with the unselected bit lines being grounded. Precharge and develop speeds of the partial page read mode are generally slower than those of the full page read mode in which all bit lines are precharged at the same time. The time parameters tPRE_2H, tDEV_2H, and tLAT_2H of the partial page read mode can be determined according to the above-described conditions.

In the embodiment of FIG. 7, it is necessary to adjust the time parameters tPRE_2H, tDEV_2H, and tLAT_2H of the partial page read mode. In the event that the partial page read mode is set up using a command/address, the time parameters tPRE_2H, tDEV_2H, and tLAT_2H may be set up optimally according to a command/address. Alternatively, where a read mode is set up by setting of a set feature, the time parameters tPRE_2H, tDEV_2H, and tLAT_2H may be adjusted via a setup operation of the set feature.

Figure 8:
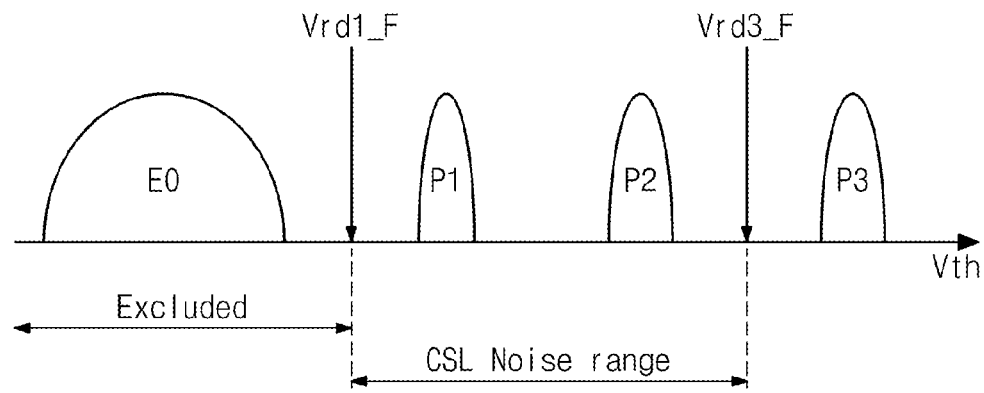
FIG. 8 is a diagram illustrating common source line (CSL) noise in a read operation of a nonvolatile memory device according to an embodiment of the inventive concept.

FIG. 8 is a diagram illustrating CSL noise in a read operation of a nonvolatile memory device according to an embodiment of the inventive concept. As illustrated by FIG. 8, a CSL noise range is widened in a second page read operation of a partial page read mode.

Fine sensing is performed using a fine read voltage Vrd3_F to discriminate program states P2 and P3. Herein, if all bit lines selected in the partial page read mode are precharged and sensed, CSL noise is generated. However, because sensing for discriminating an erase state E0 and a program state P1 is previously completed, it is possible to exclude erase cells using a sensing result. That is, memory cells each having a threshold voltage lower than a fine read voltage Vrd1_F may be selected, and the selected memory cells may be excluded in the fine sensing operation for discriminating program states P2 and P3.

The CSL noise is reduced by excluding on cells among memory cells sensed using fine read voltage Vrd_F in a sensing operation executed using fine read voltage Vrd3_F.

Figure 9:
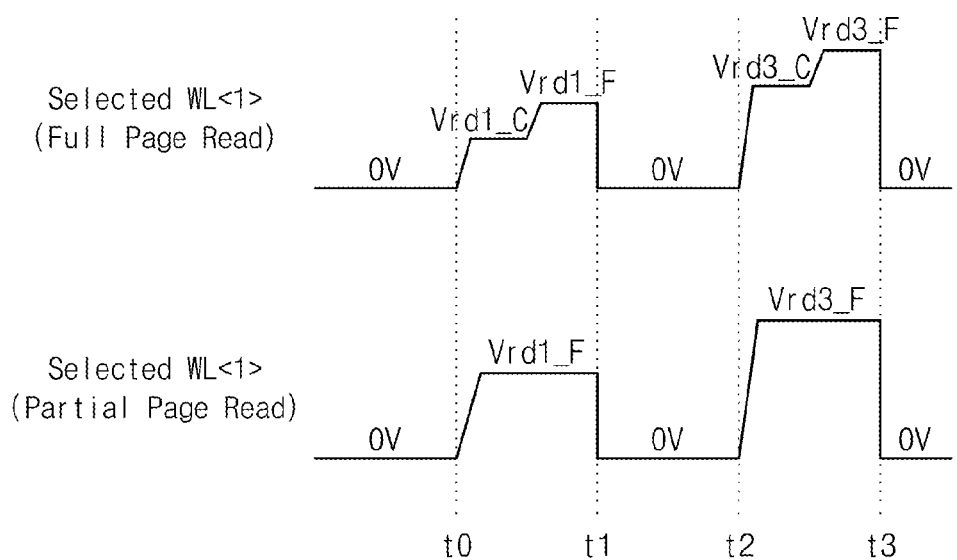
FIG. 9 is a waveform diagram illustrating word line voltages in a read mode according to an embodiment of the inventive concept.

FIG. 9 is a waveform diagram illustrating word line voltages in a read mode according to an embodiment of the inventive concept. In this embodiment, a waveform of a word line voltage provided to read the second page (or, LSB page) in a full page read mode is different from that at a partial page read mode.

Referring to FIG. 9, in the full page read mode, a read voltage for coarse-fine sensing is applied to a selected word line. During a time period t0 to t1, a sensing operation is performed to discriminate between an erase state E0 and a program state P1. Read voltages Vrd1_C and Vrd1_F for coarse sensing and fine sensing are sequentially applied to a selected word line (e.g., WL<1>). During a time period t1 to t2, the selected word line is discharged. During a time period t2 to t3, a sensing operation is performed to discriminate between a program state P2 and a program state P3. Read voltages Vrd3_C and Vrd3_F for coarse sensing and fine sensing are sequentially applied to the selected word line.

In the partial page read mode, a read voltage for fine sensing is applied to a selected word line. During a time period t0 to t1, a sensing operation is performed to discriminate between an erase state E0 and a program state P1. A read voltage Vrd1_F for fine sensing is applied to a selected word line (e.g., WL<1>). During a time period t1 to t2, the selected word line is discharged. During a time period t2 to t3, a sensing operation is performed to discriminate between a program state P2 and a program state P3. A read voltage Vrd3_F for fine sensing is applied to the selected word line. In the partial page read mode, a waveform or a pulse width can be modified or changed variously.

Figure 10:
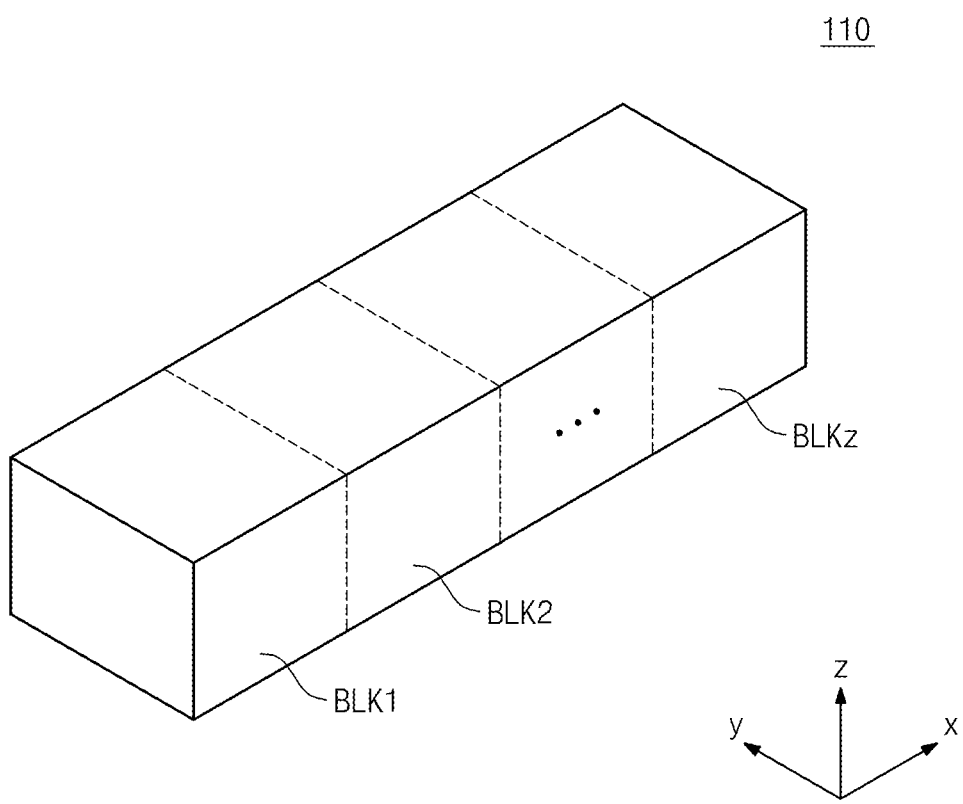
FIG. 10 is a diagram illustrating an example of a memory cell array shown in FIG. 1 according to an embodiment of the inventive concept.

FIG. 10 is a diagram illustrating an example of memory cell array 110 of FIG. 1 according to an embodiment of the inventive concept.

Referring to FIG. 10, memory cell array 110 comprises a plurality of memory blocks BLK1 to BLKz each formed with a three-dimensional structure (or, a vertical structure). In particular, each of memory blocks BLK1 to BLKz comprises structures extending along first to third directions x, y, and z. Each of memory blocks BLK1 to BLKz comprises a plurality of NAND cell strings extending along the third direction z.

Each NAND cell string is coupled with a bit line BL, a string selection line SSL, a plurality of word lines WL, a ground selection line GSL, and a common source line CSL. Accordingly, each memory block is coupled with a plurality of bit lines, a plurality of string selection lines, a plurality of word lines, a plurality of ground selection lines, and a common source line CSL. Memory blocks will be more fully described with reference to FIG. 11.

Figure 11:
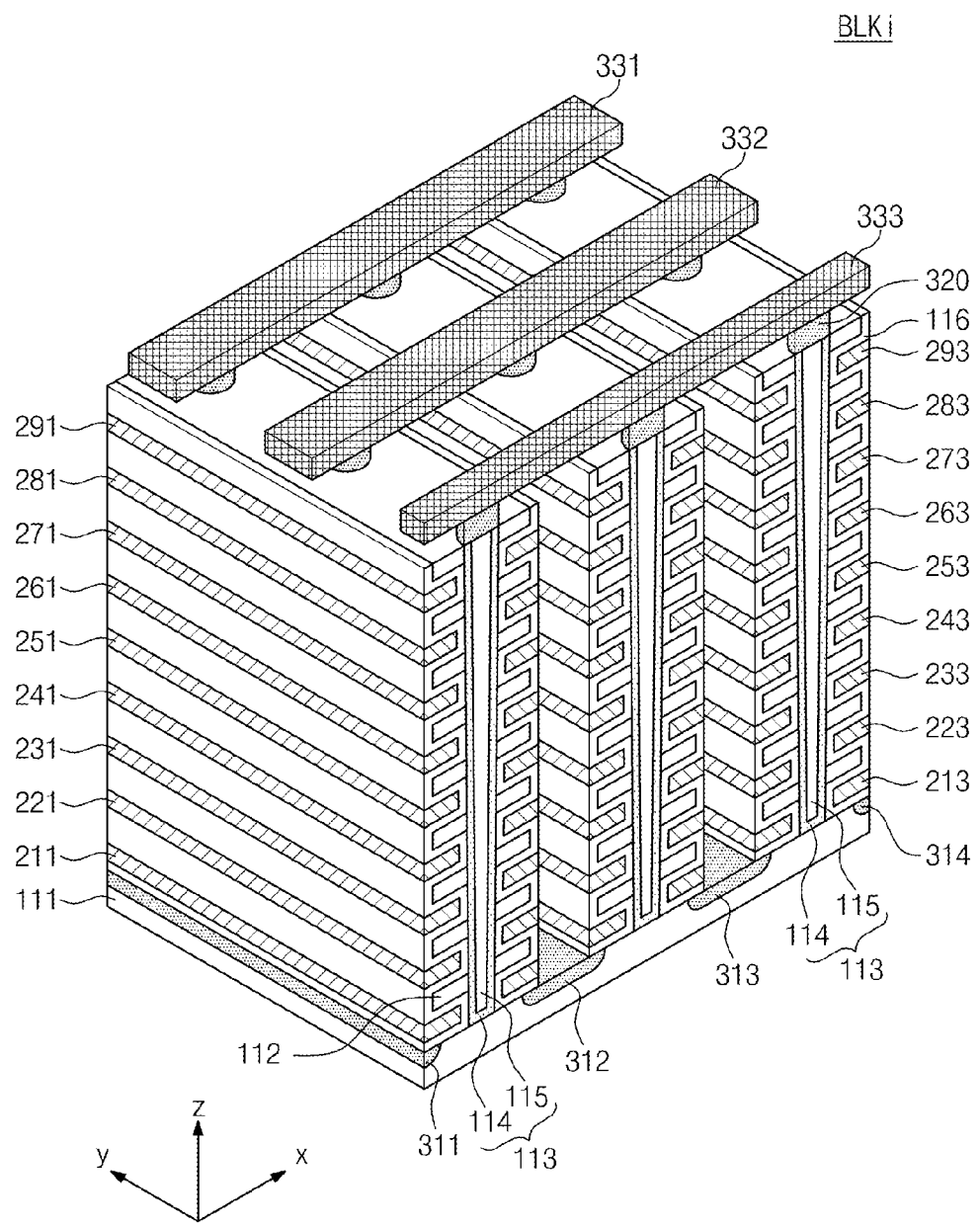
FIG. 11 is a perspective view of a memory block shown in FIG. 10.

FIG. 11 is a perspective view of one of the memory blocks in FIG. 10. Referring to FIG. 11, a memory block BLKi comprises structures that are extended in the first to third directions x, y, and z. These structures can be formed using a process described below.

First, a substrate 111 is provided to form memory block BLKi. In some embodiments, substrate 111 comprises a silicon material to which the first type impurity is injected. For example, substrate 111 may be formed of a p-well where Group IV element such as boron is injected. As an example, substrate 111 may be a pocket p well provided within an n-well. Hereinafter, it is assumed that substrate 111 is a p-well. However, substrate 111 is not limited thereto.

A plurality of doping regions 311 to 314 extending in the first direction x are formed on substrate 111. For example, doping regions 311 to 314 may have an n-type, respectively. Hereinafter, it is assumed that the first to fourth doping regions 311 to 314 are n-type. However, the first to fourth doping regions 311 to 314 are not limited to n-type.

At a region on substrate 111 between the first and second doping regions 311 and 312, a plurality of insulating materials 112 extending along the first direction may be sequentially provided along the third direction. For example, the plurality of insulating materials 112 may be formed to be spaced apart along the third direction z. Exemplarily, insulating materials 112 may include an insulating material such as silicon oxide.

On substrate 111 between the first and second doping regions 311 and 312, a plurality of pillars 113 are provided which are sequentially disposed along the second direction and pass through insulating materials 112 along the third direction. Pillars 113 are connected to substrate 111 through insulating materials 112, respectively. Herein, pillars 113 are formed on substrate 111 between the second and third doping regions 312 and 313 and between third and fourth doping regions 313 and 314, respectively.

Each of pillars 113 can be formed of a plurality of materials. For example, surface layer 114 of each pillar 113 may include a silicon material having the first type. For example, surface layer 114 of each pillar 113 may include a silicon material which is doped by the same type of dopant as substrate 111. Hereinafter, it is assumed that surface layer 114 of each pillar 113 includes p-type silicon. However, surface layer 114 of each pillar 113 is not limited thereto.

Inner layer 115 of each pillar 113 may be formed of an insulating material. For example, inner layer 115 of each pillar 113 may be filled by an insulating material such as silicon oxide. For example, inner layer 115 of each pillar 113 may include air gap.

In a region between first and second doping regions 311 and 312, an insulation layer 116 is provided along the exposed surfaces of substrate 111, insulating materials 112, and pillars 113. Insulation layer 116 can be removed from an exposed surface of a top insulation material 112.

The thickness of insulation layer 116 is typically less than half a distance between insulating materials 112. Accordingly, an intervening material may be located between insulating materials 112 and insulation layer 116 at a lower portion of memory block BLKi.

In a region between first and second doping regions 311 and 312, first conductive materials 211 to 291 are formed on an exposed surface of insulation layer 116. For example, conductive material 211 extending along the second direction y is provided between substrate 111 and insulating material 112 adjacent to substrate 111. More specifically, conductive material 211 extending along the first direction x is provided between substrate 111 and insulation layer 116 of the lower surface of insulating material 112 adjacent to substrate 111.

The first conductive material extending along the first direction is provided between insulation layer 116 of an upper surface of a specific insulating material among insulating materials 112 and insulation layer 116 of a lower surface of an insulating material disposed at the upper portion of the specific insulating material. First conductive materials 221 to 281 extending along the first direction are provided between insulating materials 112. First conductive materials 211 to 291 can be metal materials, and conductive materials 211 to 291 can be conductive materials such as polysilicon, for example.

A structure similar to that formed between first and second doping regions 311 and 312 is also formed between second and third doping regions 312 and 313. In particular, between second and third doping regions 312 and 313, there are insulating materials 112 extending along the first direction, pillars 113 sequentially disposed along the first direction and passing through insulating materials 112 along the third direction, insulation layer 116 on insulating materials 112 and exposed surfaces of pillars 113, and first conductive materials 212 to 292 extending along the first direction.

A structure similar to that formed between first and second doping regions 311 and 312 is also provided between third and fourth doping regions 313 and 314. In particular, between third and fourth doping regions 313 and 314, there are insulating materials 112 extending along the first direction, pillars 113 sequentially disposed along the first direction and passing through insulating materials 112 along the third direction, insulation layer 116 on insulating materials 112 and the exposed surfaces of pillars 113, and conductive materials 213 to 293 extending along the first direction.

Drains 320 are provided on pillars 113, respectively. Drains 320 are silicon materials that are doped with a second type dopant. For example, drains 320 may be n-type silicon materials. Hereinafter, it is assumed that drains 320 may include n-type silicon. However, drains 320 are not limited thereto. Exemplarily, the width of each of drains 320 may be greater than that of a corresponding pillar 113. For example, each drain 320 may be provided in a pad shape on the upper surface of a corresponding pillar 113.

Second conductive materials 331 to 333 extending along the third direction are provided on drains 320. Second conductive materials 331 to 333 are sequentially disposed along the first direction. Second conductive materials 331 to 333 are connected to drains 320 of corresponding regions, respectively. Drains 320 and the conductive material extending along the third direction are connected through contact plugs. The second conductive materials 331 to 333 extending along the third direction may be metal materials, and second conductive materials 331 to 333 may be conductive materials such as polysilicon, for example.

Figure 12:
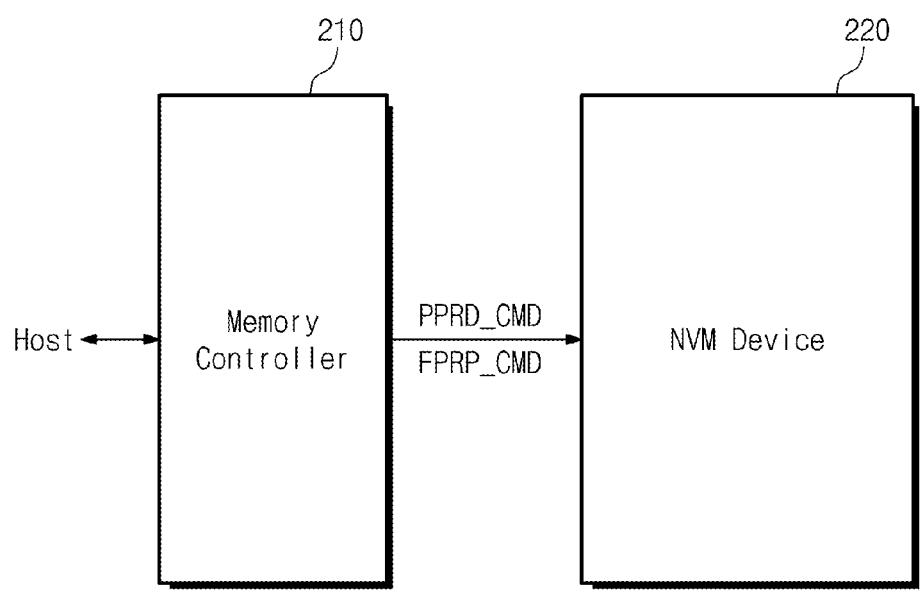
FIG. 12 is a block diagram illustrating a memory system according to an embodiment of the inventive concept.

FIG. 12 is a block diagram illustrating a memory system 200 according to an embodiment of the inventive concept.

Referring to FIG. 12, memory system 200 comprises a memory controller 210 and a nonvolatile memory device 220. Memory controller 210 selects a read mode of nonvolatile memory device 220 using a command.

Memory controller 210 decodes a read request from a host, and it determines whether the read request corresponds to a full page read mode or a partial page read mode. Where the read request corresponds to the full page read mode, memory controller 210 provides a full page read command FPRD_CMD to nonvolatile memory device 220. Where the read request corresponds to the partial page read mode, memory controller 210 provides a partial page read command PPRD_CMD to nonvolatile memory device 220.

Nonvolatile memory device 220 accesses memory cells based upon a read command FPRD_CMD or PPRD_CMD from memory controller 210. If a read command provided from memory controller 210 corresponds to the full page read mode, nonvolatile memory device 220 senses all memory cells in a selected page. At this time, memory cells in the selected page may be read in a coarse-fine sensing manner. If a read command provided from memory controller 210 corresponds to the partial page read mode, nonvolatile memory device 220 senses some memory cells in the selected page. At this time, the selected memory cells may be read in a fine sensing manner instead of the coarse-fine sensing manner. Of course, time parameters for fine sensing in the partial page read mode may be adjusted, not values used in the coarse-fine sensing manner.

Figure 13:
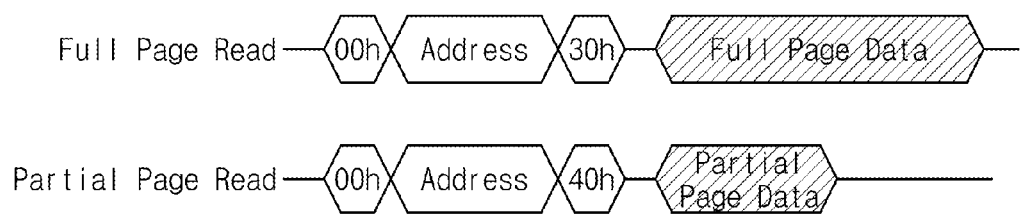
FIG. 13 is a timing diagram illustrating a read command of the memory system of FIG. 12.

FIG. 13 is a timing diagram illustrating a read command of memory system 200. More specifically, FIG. 13 shows a command input sequence in a full page read mode and a command input sequence in a partial page read mode.

In the full page read mode, memory controller 210 provides nonvolatile memory device 220 with a typical page read command. For example, memory controller 210 may provide nonvolatile memory device 220 with a command/address sequence 00h-Address-30h. Nonvolatile memory device 220 selects a page corresponding to the address and performs sensing on the selected page in a coarse-fine sensing manner Nonvolatile memory device 220 latches sensed full page data and outputs the full page data after a predetermined time.

In the partial page read mode, memory controller 210 provides nonvolatile memory device 220 with the partial page read command PPRD_CMD. For example, memory controller 210 may provide nonvolatile memory device 220 with a command/address sequence 00h-Address-40h. Nonvolatile memory device 220 selects a page corresponding to the address and performs sensing on the selected page in a fine sensing manner Nonvolatile memory device 220 latches sensed partial page data and outputs it as partial page data after a predetermined time.

In the partial page read mode, sensed partial page data is output to an external device immediately when it is latched. Accordingly, sensing-completed partial page data is output before sensing on a whole page is completed. This means that output timing of partial page data is nearly identical to that of full page data or is faster than that of the full page data. The reason is because only fine sensing is made in the partial page read mode although time parameters are changed.

Figure 14:
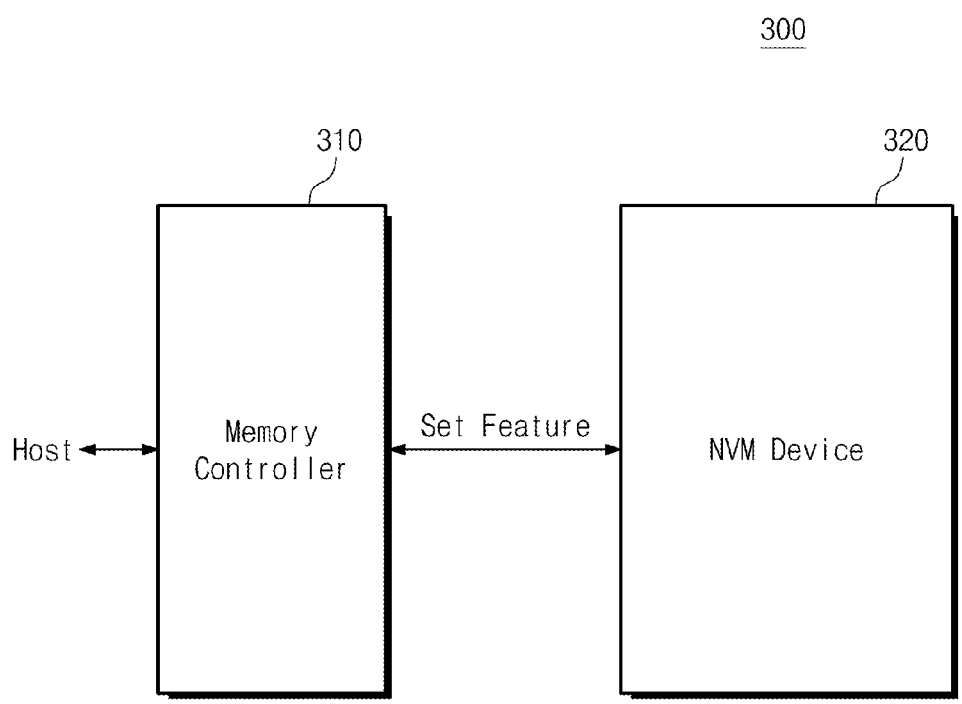
FIG. 14 is a block diagram illustrating a memory system according to another embodiment of the inventive concept.

FIG. 14 is a block diagram illustrating a memory system 300 according to another embodiment of the inventive concept.

Referring to FIG. 14, memory system 300 comprises a memory controller 310 and a nonvolatile memory device 320. Memory controller 310 sets up a read mode of nonvolatile memory device 320 using a set feature command.

Memory controller 310 decodes a read request from a host. Memory controller 310 determines whether the read request corresponds to a full page read mode or a partial page read mode. If the read request corresponds to the full page read mode, memory controller 310 provides nonvolatile memory device 320 with a typical page read command. If the read request corresponds to the partial page read mode, memory controller 310 provides nonvolatile memory device 320 with a set feature command. This is to switch into a set feature corresponding to the partial page read mode. If setup of the set feature is completed, memory controller 310 provides nonvolatile memory device 320 with a read command and an address.

Nonvolatile memory device 320 sets overall parameters for executing a read mode based upon the set feature command from memory controller 310. In a default state, e.g., before the set feature command is provided, a read mode of nonvolatile memory device 320 may have a set feature corresponding to the full page read mode. If the set feature command is provided, parameters of nonvolatile memory device 320 may be adjusted to execute the partial page read mode. Nonvolatile memory device 320 may be again set up to the default state by a command for recovering a set feature to a condition for the full page read mode.

Figure 15:
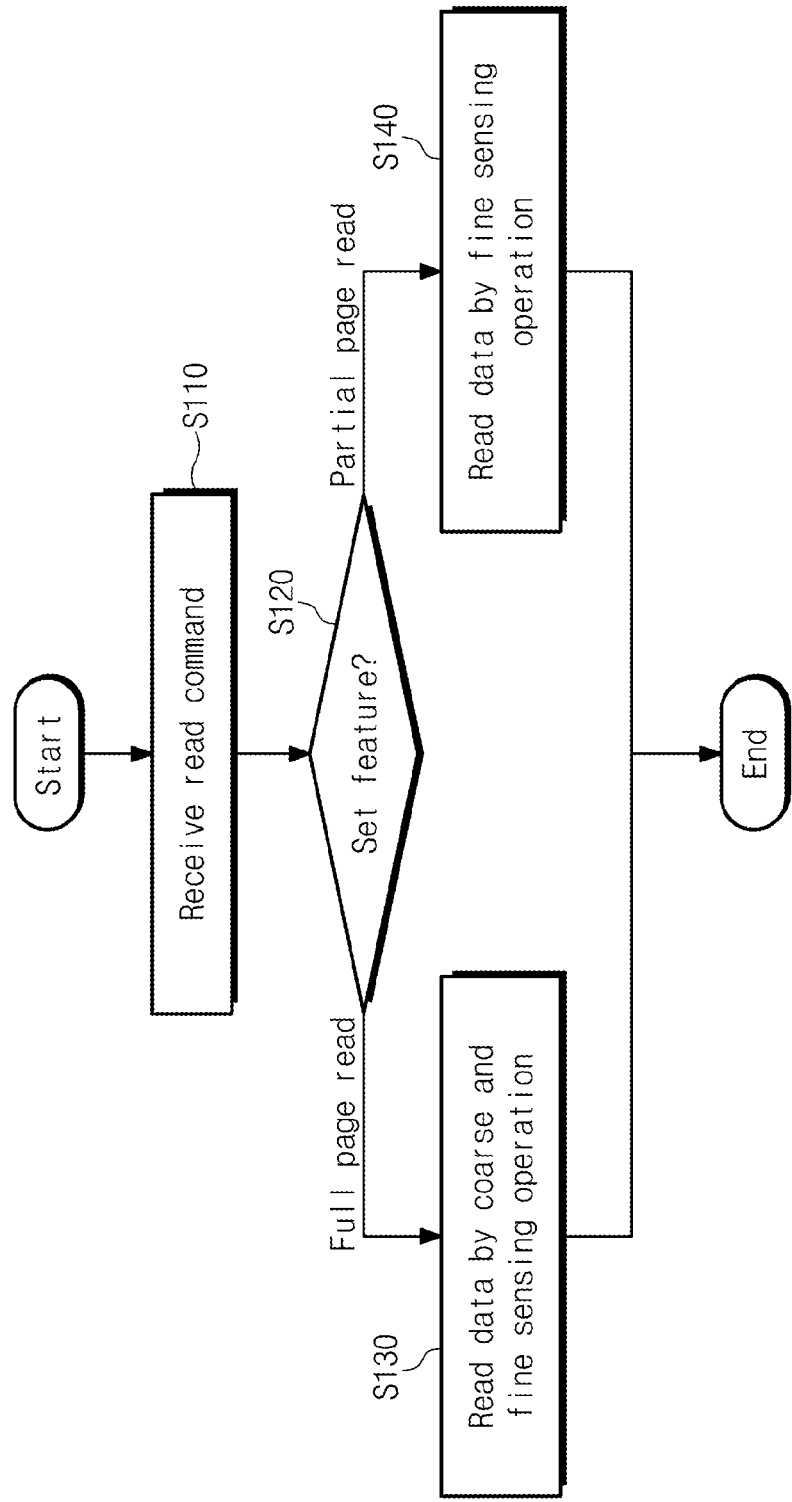
FIG. 15 is a flowchart illustrating an operation of the memory system of FIG. 14.

FIG. 15 is a flowchart illustrating an operation of memory system 300 of FIG. 14. In this operation, nonvolatile memory device 320 executes a read command from memory controller 310 based on a set feature value being internally configured. It is assumed that a read mode of nonvolatile memory device 320 is previously set up by a set feature command.

Referring to FIG. 15, in an operation S110, nonvolatile memory device 320 receives a read command from memory controller 310. A read command sequence input to nonvolatile memory device 320 does not include selection information of a read mode.

In an operation S120, nonvolatile memory device 320 checks a previously established read mode in order to execute the input read command. For example, nonvolatile memory device 320 may judge whether the previously established set feature corresponds to a full page read mode or a partial page read mode. If the previously established set feature corresponds to the full page read mode, the method proceeds to an operation S130. If the previously established set feature corresponds to the partial page read mode, the method proceeds to an operation S140.

In operation S130, nonvolatile memory device 320 senses memory cells corresponding to an input address according to the full page read mode. In the full page read mode, nonvolatile memory device 320 senses selected memory cells in a coarse-fine sensing manner After the sensed data is output, reading of the requested data is ended.

In operation S140, nonvolatile memory device 320 senses memory cells corresponding to an input address according to the partial page read mode. A voltage corresponding to fine sensing may be provided as a read voltage when selected memory cells are sensed according to the partial page read mode. Where multi-bit page over the second page is read, data may be sensed in a manner described in FIG. 8 to minimize CSL noise.

Data of a page selected according to a read operation of nonvolatile memory device 320 is sensed according to the full page read mode or the partial page read mode.

Figure 16:
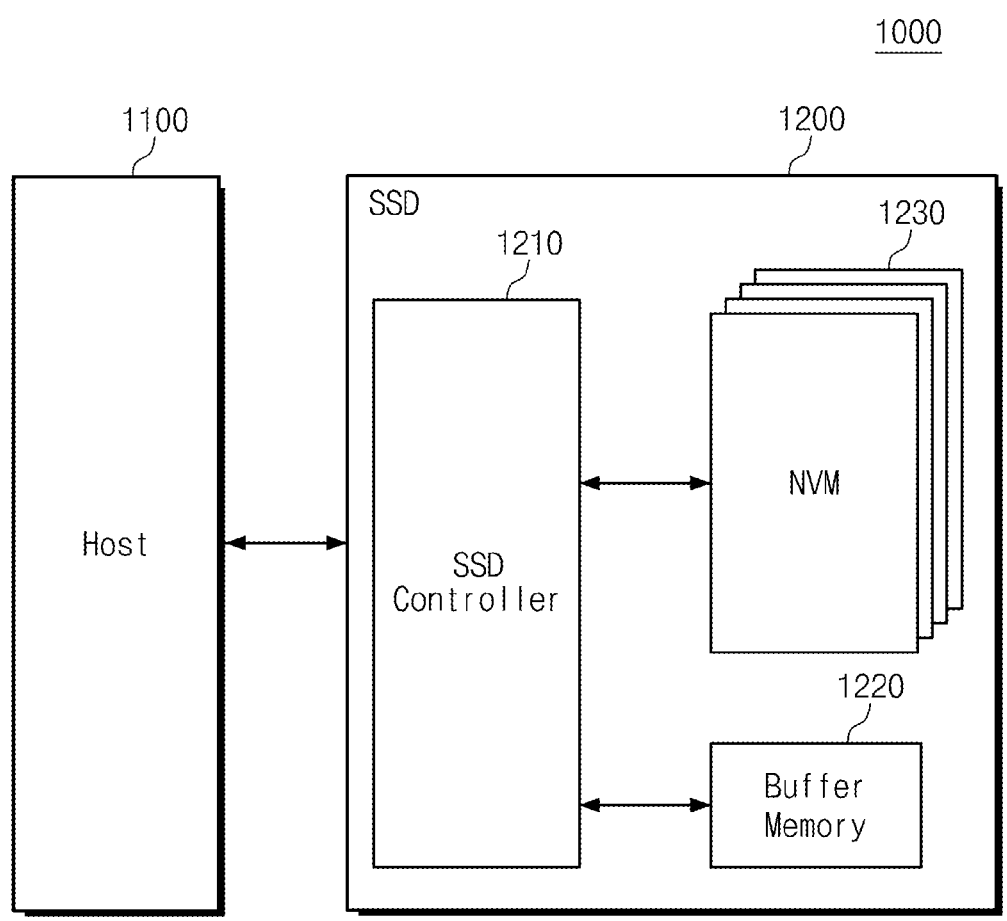
FIG. 16 is a block diagram illustrating a system comprising a solid state drive (SSD) according to an embodiment of the inventive concept.

FIG. 16 is a block diagram illustrating a system 1000 comprising an SSD according to an embodiment of the inventive concept.

Referring to FIG. 16, system 1000 comprises a host 1100 and an SSD 1200. SSD 1200 comprises an SSD controller 1210, a buffer memory 1220, and a nonvolatile memory device 1230.

SSD controller 1210 provides physical interconnection between host 1100 and SSD 1200. SSD controller 1210 provides an interface with SSD 1200 corresponding to a bus format of host 1100. In particular, SSD controller 1210 decodes a command provided from host 1100. SSD controller 1210 accesses nonvolatile memory device 1230 according to the decoding result. The bus format of host 1100 can be, for instance, universal serial bus (USB), small computer system interface (SCSI), peripheral component interconnect express (PCI-E), advanced technology attachment (ATA), parallel ATA (PATA), serial ATA (SATA), or serial attached SCSI (SAS).

SSD controller 1210 decodes a read request from host 1100 to select one of a partial page read mode and a full page read mode. SSD controller 1210 controls nonvolatile memory device 1230 to access memory cells according to a corresponding read mode. For example, SSD controller 1210 may control nonvolatile memory device 1230 using a specific read command (e.g., a partial page read command) or to set up a set feature.

Buffer memory 1220 temporarily stores write data provided from host 1100 or data read out from nonvolatile memory device 1230. In the event that data in nonvolatile memory device 1230 is cached at a read request of host 1100, buffer memory 1220 may support a cache function for providing cached data directly to host 1100. Typically, a data transfer speed of a bus format (e.g., SATA or SAS) of host 1100 may be higher than that of a memory channel of SSD 1200. That is, in the event that an interface speed of host 1100 is remarkably fast, lowering of the performance due to a speed difference may be minimized by providing buffer memory 1220 having a large storage capacity.

Buffer memory 1220 may be formed of a synchronous DRAM to provide sufficient buffering to SSD 1200 used as an auxiliary mass storage device. However, buffer memory 1220 is not limited to this implementation.

Nonvolatile memory device 1230 may be provided as a storage medium of SSD 1200. For example, nonvolatile memory device 1230 may comprise a NAND flash memory device providing mass storage capacity. Nonvolatile memory device 1230 can be formed of a plurality of memory devices, and these memory devices may be connected with SSD controller 1210 by a channel unit.

Nonvolatile memory device 1230 is not limited to a NAND flash memory device. For example, a PRAM, an MRAM, a ReRAM, a FRAM, a NOR flash memory, etc. may be used as a storage medium of SSD 1200. Further, in some embodiments, system 100 may use different types of memory devices together. Nonvolatile memory device 1230 may be configured substantially the same as nonvolatile memory device 100 of FIG. 1.

Figure 17:
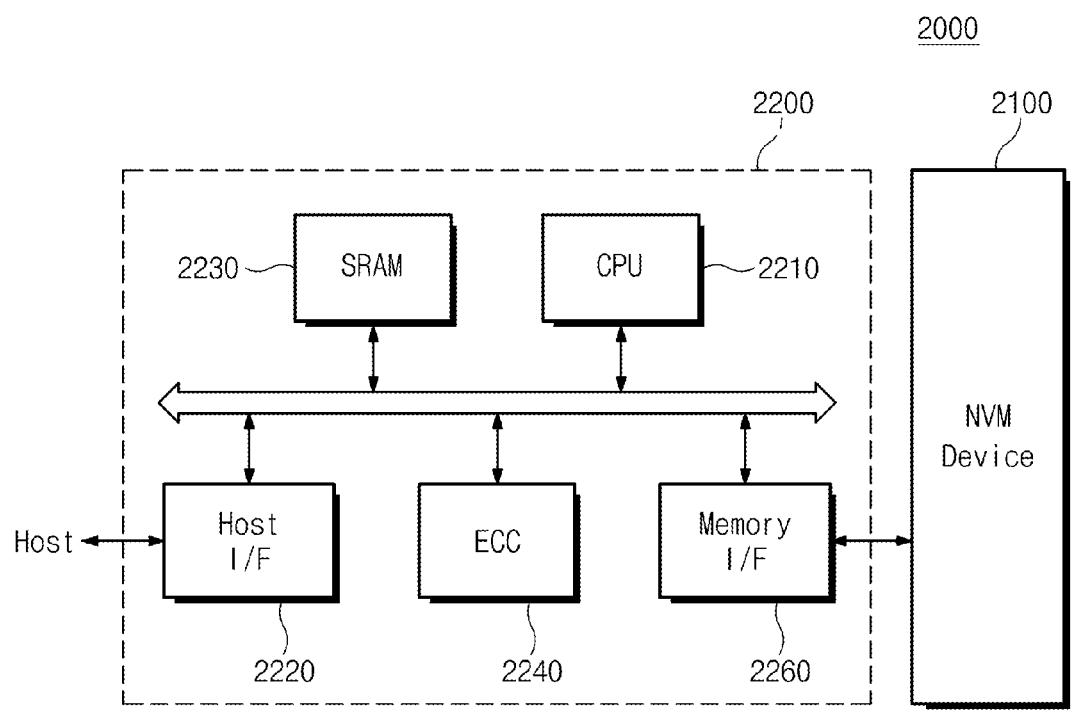
FIG. 17 is a block diagram illustrating a memory system according to another embodiment of the inventive concept.

FIG. 17 is a block diagram illustrating a memory system 200 according to another embodiment of the inventive concept.

Referring to FIG. 17, memory system 2000 comprises a nonvolatile memory device 2100 and a memory controller 2200.

Nonvolatile memory device 2100 is configured substantially the same as nonvolatile memory device 100 of FIG. 1. Memory controller 2200 is configured to control nonvolatile memory device 2100. An SRAM 2230 is used as a working memory of a CPU 2210. A host interface 2220 implements a data exchange protocol with a host connected to memory system 2000. An ECC block 2240 is configured to detect and correct errors included in data read out from nonvolatile memory device 2100. A memory interface 2260 may interface with nonvolatile memory device 2100 according to an embodiment of the inventive concept. CPU 2210 may execute an overall control operation for data exchange of memory controller 2200. Although not shown in FIG. 17, memory system 2000 may further include ROM which stores code data for interfacing with the host.

Memory controller 2200 may communicate with an external device (e.g., a host) using an interface protocol such as USB, MMC, PCI-E, SAS, SATA, PATA, SCSI, ESDI, or IDE.

Memory controller 2200 decodes a read request from a host to select one of a partial page read mode and a full page read mode. Memory controller 2200 controls nonvolatile memory device 2100 to access memory cells according to a corresponding read mode. For example, memory controller 2200 may control nonvolatile memory device 2100 using a specific read command (e.g., a partial page read command) or to set up a set feature.

Memory system 2000 can be used in various contexts, such as a computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices forming a computing system.

Figure 18:
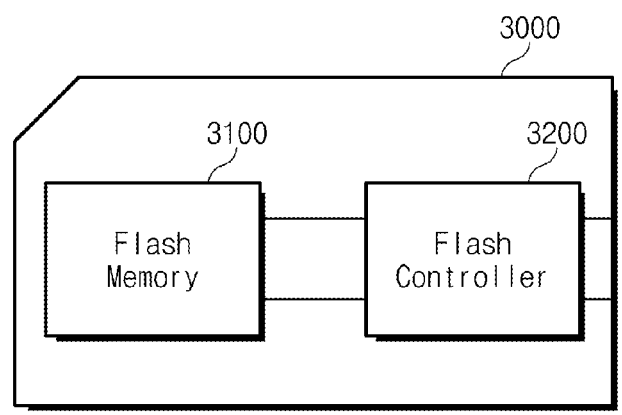
FIG. 18 is a block diagram illustrating a data storage device according to an embodiment of the inventive concept.

FIG. 18 is a block diagram illustrating a data storage device 3000 according to still another embodiment of the inventive concept.

Referring to FIG. 18, data storage device 3000 comprises a flash memory 3100 and a flash controller 3200. Flash controller 3200 controls flash memory 3100 in response to control signals input from the outside of data storage device 3000.

Flash memory 3100 is configured substantially the same as nonvolatile memory device 100 of FIG. 1. Flash memory 3100 can be configured with any of various structures, such as a stack flash structure including arrays stacked at multiple layers, a source-drain free flash structure, a pin-type flash structure, or a three-dimensional (or, vertical) flash structure.

Flash controller 3200 decodes a read request from a host to select one of a partial page read mode and a full page read mode. Flash controller 3200 controls flash memory 3100 to access memory cells according to a corresponding read mode. For example, flash controller 3200 may control flash memory 3100 using a specific read command (e.g., a partial page read command) or to set up a set feature.

Data storage device 3000 can take any of various alternative forms, such as a memory card device, an SSD device, a multimedia card device, an SD device, a memory stick device, a HDD device, a hybrid drive device, or an USB flash device. Moreover, data storage device 3000 may be a card that satisfies a standard for using a user device such as a digital camera or a personal computer.

Figure 19:
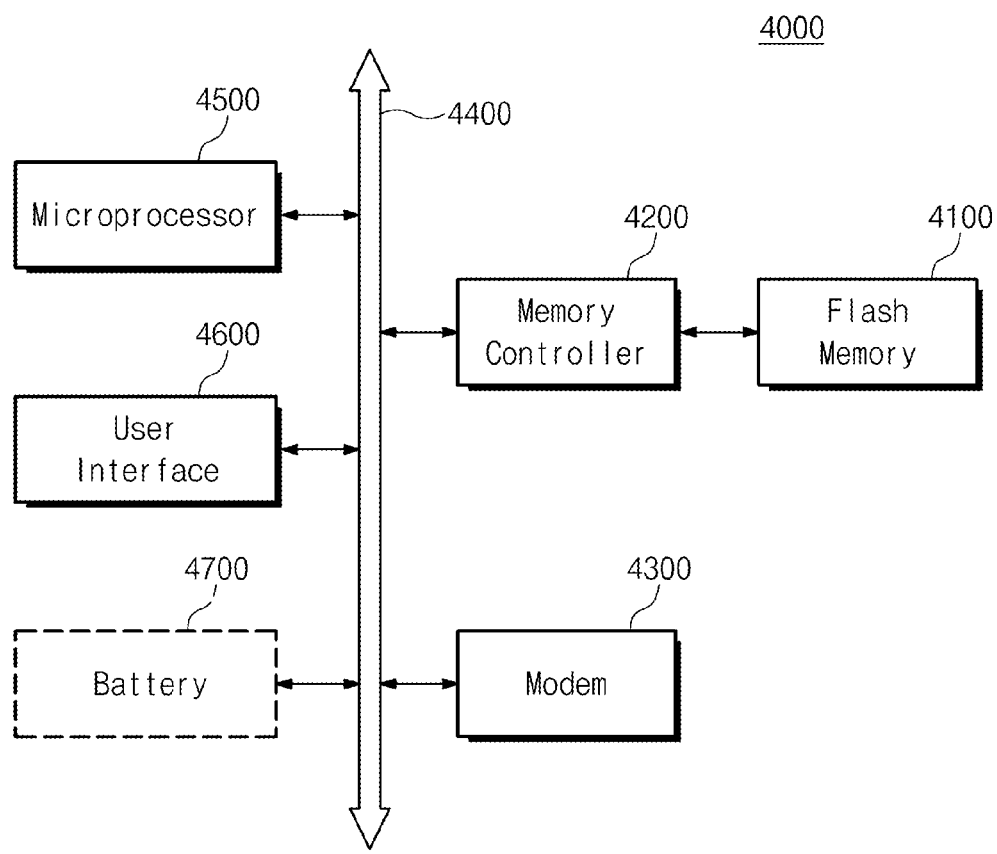
FIG. 19 is a block diagram illustrating a computing system comprising a memory system according to an embodiment of the inventive concept.

FIG. 19 is a block diagram illustrating a computing system 4000 comprising a memory system according to an embodiment of the inventive concept.

Referring to FIG. 19, computing system 4000 comprises a flash memory device 4100, a memory controller 4200, a modem 4300 such as a baseband chipset, a microprocessor 4500, and a user interface 4600.

Flash memory device 4100 of FIG. 19 is configured substantially the same as nonvolatile memory device 100 of FIG. 1. Flash memory device 4100 can be configured with any of various alternative structures, such as a stack flash structure comprising arrays stacked in multiple layers, a source-drain free flash structure, a pin-type flash structure, and a three-dimensional (or, vertical) flash structure.

Flash memory device 4100 comprises a cell array having an all bit line structure. Flash memory device 4100 executes a partial page read mode additionally. In the partial page read mode, flash memory device 4100 grounds unselected bit lines and performs fine sensing on selected bit lines.

Where computing system 4000 is a mobile device, it may further comprise a battery 4700 that powers computing system 4000. Although not shown in FIG. 19, computing system 4000 may further comprise an application chipset, a camera image processor (CIS), or a mobile DRAM. Memory controller 4200 and flash memory device 4100 may constitute an SSD which uses a nonvolatile memory to store data.

A nonvolatile memory device or a memory controller as described above may be packed using any of various types of packages or package configurations, such as, e.g., package on package (PoP), ball grid arrays (BGAs), chip scale packages (CSPs), plastic leaded chip carrier (PLCC), plastic dual in-line package (PDI2P), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP).

The foregoing is illustrative of embodiments and is not to be construed as limiting thereof. Although various embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A storage device, comprising:
a nonvolatile memory device; and
a memory controller configured to selectively transmit one of a page read command with a first address and a partial page read command with a second address to the nonvolatile memory device, in response to a read request from a host, wherein:
the nonvolatile memory device performs a first read operation in response to the page read command with the first address, or performs a second read operation in response to the partial page read command with the second address,
a number of selected memory cells of the second read operation is smaller than a number of selected memory cells of the first read operation,
a time required to perform the first read operation is longer than a time required to perform the second read operation,
each of the first address and the second address corresponds to the same row,
a first read voltage and a second read voltage are applied to a word line of the selected memory cells during the first read operation to discriminate at least one data state, and
at least one memory cell identified as an off cell by the first read voltage is sensed during a sensing operation using the second read voltage.

2. The device of claim 1, wherein a number of sensing operations being performed during the second read operation for discriminating at least one data state among a plurality of data states is smaller than a number of sensing operations being performed during the first read operation.

3. The device of claim 2, wherein at least two sensing operations are performed during the first read operation to discriminate the at least one data state, while at least one sensing operation is performed during the second read operation.

4. The device of claim 1, wherein a first precharge time for precharging bit lines of the selected memory cells during the first read operation is different from a second precharge time for precharging bit lines of the selected memory cells during the second read operation.

5. The device of claim 4, wherein the first precharge time is shorter than the second precharge time.

6. The device of claim 1, wherein the nonvolatile memory device comprises a plurality of memory cells stacked in a direction crossing over a substrate.

7. The device of claim 1, wherein the number of selected memory cells of the second read operation corresponds to half number of the selected memory cells of the first read operation.

8. A nonvolatile memory device, comprising:
a cell array including a plurality of memory cells formed with a three-dimensional structure;
a page buffer configured to sense memory cells connected to a selected word line via a plurality of bit lines;
a voltage generator configured to provide a read voltage to the selected word line; and
a control logic configured to control the page buffer and the voltage generator to perform a first read operation in response to a page read command and a first address, or a second read operation in response to a partial page read command and a second address, wherein:
a number of memory cells to be sensed in the first read operation is larger than a number of memory cells to be sensed in the second read operation,
each of the first address and the second address corresponds to the same row,
a first read voltage and a second read voltage are applied to the selected word line during the first read operation to discriminate at least one data state, and
at least one memory cell identified as an off cell by the first read voltage is sensed during a sensing operation using the second read voltage.

9. The memory device of claim 8, wherein a time to perform the first read operation is longer than a time to perform the second read operation.

10. The memory device of claim 8, wherein the voltage generator provides the selected word line with at least two levels of read voltages to discriminate between two data states in the first read operation, whereas the voltage generator provides the selected word line with one level of read voltage to discriminate between the two states in the second read operation.

11. The memory device of claim 10, wherein the control logic controls the page buffer to differentiate a bit line precharge time between the first read operation and the second read operation for precharging bit lines of the selected memory cells.

12. The memory device of 11, wherein the bit line precharge time of the first read operation is shorter than the bit line precharge time of the second read operation.

13. The memory device of claim 8, wherein the number of memory cells to be sensed in the second read operation is half of the number of memory cells to be sensed in the first read operation.

14. The memory device of claim 8, wherein in the second read operation, the controller controls the page buffer or the voltage generator to select off cells by the first read voltage, and to perform a sensing operation on the selected off cells using the second read voltage.

15. The memory device of claim 14, wherein the first read voltage corresponds to a first data state and the second read voltage corresponds to a second data state associated with a higher threshold voltage than the first data state.

16. A method of operating a storage device including a nonvolatile memory device, the method comprising:
receiving a read request from a host;
selecting one of a page read operation and partial-page read operation by decoding the read request;
transmitting a page read command and a first address, or a partial-page read command and a second address to the nonvolatile memory device; and
sensing selected memory cells via a page read operation corresponding to the page read command, or a partial-page read operation corresponding to the partial-page read command, wherein:
the nonvolatile memory device senses a first portion of memory cells of the selected memory cells during the partial-page read operation,
each of the first address and the second address corresponds to the same row,
a first read voltage and a second read voltage are applied to a word line of the selected memory cells during the page read operation to discriminate at least one data state, and
at least one memory cell identified as an off cell by the first read voltage is sensed during a sensing operation using the second read voltage.

17. The method of claim 16, wherein in the page read operation, the nonvolatile memory device performs a sensing operation on the selected memory cells via a coarse read voltage and a fine read voltage to discriminate the one data state of the selected memory cells.

18. The method of claim 16, wherein in the partial-page read operation, the nonvolatile memory device senses the first portion of memory cells via a fine read voltage.

19. The method of claim 16, wherein at least one time parameter for sensing bit lines of the selected memory cells in the partial-page read operation is different from a time parameter in the page read operation.

20. The method of claim 19, wherein a first precharge time for precharging the bit lines of the selected memory cells in the page read operation is different from a second precharge time for precharging the bit lines of the selected memory cells in the partial-page read operation.

21. The method of claim 16, wherein the number of memory cells to be sensed in the partial-page page read operation is half of the number of memory cells to be sensed in the page read operation.

22. A solid state drive, comprising:
a nonvolatile memory device;
a storage controller configured to selectively transmit one of a page read command with a first address and a partial-page read command with a second address to the nonvolatile memory device in response to a read request from a host; and
a buffer memory configured to store output data from the nonvolatile memory device, wherein:
the nonvolatile memory device performs a first read operation in response to the page read command to transmit page data to the buffer memory, and performs a second read operation in response to the partial-page read command to transmit partial-page data to the buffer memory,
a number of selected memory cells of the second read operation is smaller than a number of selected memory cells of the first read operation, and a time to perform the first read operation is longer than a time to perform the second read operation,
each of the first address and the second address corresponds to the same row,
a first read voltage and a second read voltage are applied to a word line of the selected memory cells, of the first read operation, during the first read operation to discriminate at least one data state, and
at least one memory cell identified as an off cell by the first read voltage is sensed during a sensing operation using the second read voltage.

23. The device of claim 22, wherein a first bit line precharge time of the first read operation is shorter than a second bit line precharge time of the second read operation.

24. The device of claim 22, wherein at least two sensing operations are performed during the first read operation to discriminate the at least one data state, while at least one sensing operation is performed during the second read operation to discriminate at least one data state.

25. The device of claim 22, wherein the nonvolatile memory device comprises a plurality of memory cells stacked in a direction crossing over a substrate.

26. The device of claim 12, wherein the number of memory cells to be sensed in the second read operation corresponds to half of the number of memory cells to be sensed in the first read operation.

* * * * *